(12) United States Patent
D'Angelo

(10) Patent No.: US 11,018,601 B2
(45) Date of Patent: May 25, 2021

(54) HALF-BRIDGE DRIVER CIRCUIT, RELATED INTEGRATED CIRCUIT AND SYSTEM

(71) Applicant: STMicroelectronics S.r.l., Agrate Brianza (IT)

(72) Inventor: Giuseppe D'Angelo, Tufino (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 280 days.

(21) Appl. No.: 16/294,679

(22) Filed: Mar. 6, 2019

(65) Prior Publication Data

US 2019/0280619 A1    Sep. 12, 2019

(30) Foreign Application Priority Data

Mar. 7, 2018    (IT) .................. 102018000003338

(51) Int. Cl.
*H02M 7/5387* (2007.01)
*H02P 6/28* (2016.01)
(Continued)

(52) U.S. Cl.
CPC ....... *H02M 7/53873* (2013.01); *H02M 1/088* (2013.01); *H02P 6/28* (2016.02); *H03K 7/08* (2013.01); *H02M 2001/0009* (2013.01)

(58) Field of Classification Search
CPC .................................. H02M 1/088; H02P 6/28
(Continued)

(56) References Cited

U.S. PATENT DOCUMENTS 4,772,996 A    9/1988    Hanei et al.
8,957,614 B2*    2/2015    Chiu .................. H02P 27/06
318/400.13
(Continued)

FOREIGN PATENT DOCUMENTS

CN    103299540 A    9/2013
CN    103795254 A    5/2014
(Continued)

OTHER PUBLICATIONS

Arrigo, D., "L6234 Three Phase Motor Driver", AN1088 Application Note, Apr. 2001, 14 pages.
(Continued)

*Primary Examiner* — David Luo
(74) *Attorney, Agent, or Firm* — Slater Matsil, LLP

(57) ABSTRACT

A half-bridge driver circuit includes an amplifier configured to generate a measurement signal indicative of a current flowing through a shunt resistor. A processing circuit is configured to selectively acquire a sample of the measurement signal in response to a trigger signal. A synchronization circuit is configured to determine a first value indicative of the switch-on duration of a high side control signal, determine a second value indicative of the switching period of the high side control signal, compute a third value based on the first and second values, generate a third signal based on the third value when the next switching period of the high side control signal starts, start a second counter in response to the third signal, compare the count value of the second counter with a reference value to generate a fourth signal, and generate the trigger signal as a function of the fourth signal.

21 Claims, 8 Drawing Sheets

(51) Int. Cl.
*H02M 1/088* (2006.01)
*H03K 7/08* (2006.01)
*H02M 1/00* (2006.01)

(58) Field of Classification Search
USPC .................. 318/400.27, 400.26, 400.01, 700
See application file for complete search history.

(56) References Cited

U.S. PATENT DOCUMENTS

| | | | |
|---|---|---|---|
| 9,935,626 | B2 | 4/2018 | Gariboldi |
| 2003/0006749 | A1 | 1/2003 | Rollman |
| 2012/0075000 | A1 | 3/2012 | Cho et al. |
| 2017/0063364 | A1 | 3/2017 | Scorrano et al. |
| 2018/0175850 | A1 | 6/2018 | Gariboldi |

FOREIGN PATENT DOCUMENTS

| | | |
|---|---|---|
| CN | 107124125 A | 9/2017 |
| CN | 209593316 U | 11/2019 |
| EP | 1826899 A1 | 8/2007 |
| EP | 2169411 A1 | 3/2010 |
| KR | 19940008532 | 11/1994 |
| WO | 2016080950 A1 | 5/2016 |

OTHER PUBLICATIONS

Stmicroelectronics, "Automotive FET driver for 3 phase BLDC motor", ST life,augnnented, L9907, Jun. 2018, DS11800 Rev 2, 46 pages.

Khan, Mohammad Rezwan et al., "A 12-Step Voltage Source Inverter Control Circuit for Induction Motor Drives", IEEE IAS '96, Conference Record of the IEEE Industry Applications Conference Thirty-First IAS Annual Meeting, Oct. 6-10, 1996, 5 pages.

* cited by examiner

HALF-BRIDGE DRIVER CIRCUIT, RELATED INTEGRATED CIRCUIT AND SYSTEM

CROSS-REFERENCE TO RELATED APPLICATIONS

This application claims priority to Italian Patent Application No. 102018000003338, filed on Mar. 7, 2018, which application is hereby incorporated herein by reference.

TECHNICAL FIELD

The present invention relates generally to an electronic system and method and, in particular embodiments, to a half-bridge driver circuit, related integrated circuit and system.

BACKGROUND

In automotive applications, the use of Direct Current (DC) or Brushless DC (BLDC) motors for fan, pump or actuator applications is very common with the trend of replacing the traditional DC with BLDC motors. In most automotive applications, detection of fault conditions of the BLDC motor and the control electronics is mandatory. For this reason, the control electronics should be able to identify a possible fault condition and then apply counter measures, e.g., in order to protect the system. Often, the detected fault condition is reported to a system controller and may be accessible via the diagnosis interface of the automobile for further service investigations.

As disclosed, e.g., in the Italian patent application IT102016000009376, a motor is often driven by using one or more half-bridges as a function of one or more respective Pulse-Width Modulated (PWM) signals.

For example, FIG. 1 shows a typical half-bridge arrangement 20 comprising two electronic switches $SW_1$ and $SW_2$, such as n-channel power Field-Effect Transistors (FETs), such as Metal-Oxide-Semiconductor Field-Effect Transistors (MOSFETs), connected in series between supply voltage Vdd and ground GND.

Usually, the switches $SW_1$ and $SW_2$ are closed alternatively in order to connect the output OUT of the half-bridge arrangement 20, i.e., the intermediate point between the switches $SW_1$ and $SW_2$, either to the voltage Vdd or to ground GND. For this purpose, the half-bridge is driven as a function of two drive signals $DRV_1$ and $DRV_2$, which are connected (e.g., directly) to the control gates of the switches $SW_1$ and $SW_2$, respectively. Specifically, in order to correctly drive the control gates, often a high-side driver $200_1$ is used to generate the drive signal $DRV_1$ for the high-side switch $SW_1$ as a function of a first control signal $IN_1$, and a low-side driver $200_2$ is used to generate the drive signal $DRV_2$ for the low-side switch $SW_2$ as a function of a control signal $IN_2$. The control signal $IN_2$ corresponds often to an inverted version of the signal $IN_1$ (or vice versa), i.e., the signal $IN_2$ is low when the signal $IN_1$ is high and vice versa. For example, in FIG. 1, inverter 202 is used, which receives at an input the signal $IN_1$ and provides at an output the signal $IN_2$.

The output OUT of the half-bridge arrangement 20 may be used to drive a load. For example, in FIG. 1, the half-bridge arrangement 20 drives a motor $M_1$ connected between the output OUT of the half-bridge arrangement 20 and ground GND.

Conversely, FIG. 2 shows an example in which two half-bridge arrangements $20_a$ and $20_b$ are used to drive a linear motor $M_2$, such as a voice coil motor, connected between the output $OUT_a$ of the first bridge arrangement $20_a$ and the output $OUT_b$ of the second bridge arrangement $20_b$. As well known to those of skill in the art, in this case, also the rotation direction of the motor $M_2$ may be controlled by applying appropriate control signals $IN_a$ and $IN_b$ to the half-bridge arrangements $20_a$ and $20_b$.

Finally, FIG. 3 shows an example in which three half-bridge arrangements $20_a$, $20_b$ and $20_c$ are used to drive a three-phase motor $M_3$, such as a spindle motor, connected between the outputs $OUT_a$, $OUT_b$ and $OUT_c$ of three half-bridge arrangements $20_a$, $20_b$ and $20_c$.

As mentioned before, the control signals may be PWM signals, i.e., signals with a fixed frequency and a variably duty cycle. For example, Italian patent application IT102015000046790 discloses a solution for generating two PWM signals which may be used, e.g., for generating the signals $IN_a$ and $IN_b$ in the solution shown in FIG. 2.

FIG. 4 shows in this respect a typical PWM signal PWM, such as the signal $IN_1$, corresponding to a pulsed signal comprising a single pulse P for each switching cycle with duration or period $T_{PWM}$, wherein the switch-on duration $T_{ON}$ of the pulse P may be variable as a function of a control signal.

Generally, the pulse P is not necessarily at the beginning of each switching cycle, but each switching cycle may comprise an initial switch-off period $T_{OFF1}$ before the pulse P and a final switch-off period $T_{OFF2}$ after the pulse P, with:

$$T_{PWM}=T_{OFF1}+T_{ON}+T_{OFF2} \quad (1)$$

with the switch-off duration $T_{OFF}$ being:

$$T_{OFF}=T_{OFF1}+T_{OFF2} \quad (2)$$

where the duty cycle D of each switching cycle is given by:

$$D=T_{ON}/T_{PWM} \quad (3)$$

For example, in most high-end automotive applications (e.g., Electric Power Steering, Electric Turbo Charge, etc.), a Smart Power Device (SPD) is used to generate the drive signals for the high side and low side switches ($SW_1$, $SW_2$) in order to drive such a three-phase BLDC motor. A typical SPD device is the integrated circuit (IC) STMicroelectronics L9907, as described e.g., in "*L9907—Automotive FET driver for 3 phase BLDG motor—Datasheet—production data*", March 2017, DocID029666 Rev 1, which is incorporated herein by reference.

FIG. 5 schematically shows the structure of such an IC 22. Specifically, this IC 22 is able to receive at respective inputs six control signals $IN_1 \ldots IN_6$ and generate at respective outputs six drive signals $DRV_1 \ldots DRV_6$.

For example, as shown in FIG. 6, the IC 22 may be connected to a signal generator 30, such as a microcontroller, configured to generate the control signals $IN_1 \ldots IN_6$. Accordingly, the IC 22 comprises three high side drivers $200_1$, $200_3$ and $200_5$ configured to generate respective drive signals $DRV_1$, $DRV_3$ and $DRV_5$ for three high side switches $SW_1$, $SW_3$ and $SW_5$ and three low side drivers $200_2$, $200_4$ and $200_6$ configured to generate respective drive signals $DRV_2$, $DRV_4$ and $DRV_6$ for three low side switches $SW_2$, $SW_4$ and $SW_6$.

As also shown in FIG. 5, often such a SPD device 22 comprises also an electronic converter 204 configured to generate the supply voltage Vdd for the half-bridges as a function of a power supply, such as a battery voltage VBAT.

Moreover, often the IC 22 comprises differential amplifiers 206 arranged to measure the motor phase currents. Specifically, the L9907 IC comprises two differential amplifiers $206_1$ and $206_2$ arranged to generate two measurement signals $CS_1$ and $CS_2$ by measuring the current flowing through two motor phases, e.g., by using respective shunt resistors $RS_1$ and $RS_2$ connected in series with a respective motor phase. For example, as shown in FIG. 6, the measurements signals $CS_1$ and $CS_2$ may then be provided to the circuit 30 which may calculate the current of the third motor phase via Kirchhoff's law. Specifically, the circuit 30 generates the six PWM signals $IN_1 \ldots IN_6$ for the inputs of the IC 22 and synchronously monitors the two measurement signals $CS_1$, $CS_2$ at the output of the IC 22.

SUMMARY

Various embodiments relate to sampling the motor phase currents directly within a half-bridge driver circuit.

One or more embodiments relate to a half-bridge driver circuit. Embodiments moreover concern a related integrated circuit and system.

Various embodiments relate to a half-bridge driver circuit arranged to drive one or more half-bridges.

In various embodiments, the half-bridge driver circuit comprises at least two input terminals for receiving a high side control signal and a low side control signal. Specifically, the high side control signal is a center aligned pulse-width-modulated (PWM) signal having a given switching period and a given switch-on duration, and the low side control signal corresponds to an inverted version of the high side control signal with a first delay between a falling edge of the low side control signal and a following rising edge of the high side control signal and with a second delay between a falling edge of the high side control signal and a following rising edge of the low side control signal.

In various embodiments, the half-bridge driver circuit comprises two output terminals for providing a high side drive signal for a high side switch and a low side drive signal for a low side switch. For example, the high side drive signal may be generated by a high side driver circuit as a function of the high side control signal and the low side drive signal may be generated by a low side driver circuit as a function of the low side control signal.

In various embodiments, the half-bridge driver circuit comprises moreover two measurement terminals configured to be connected to the terminals of a shunt resistor. For example, the shunt resistor may be used to measure the phase current(s) of a motor connected to the half-bridge(s). The two measurement terminals are connected to an (differential) amplifier, thereby generating a measurement signal indicative of the current flowing through the shunt resistor.

In various embodiments, the half-bridge driver circuit is configured to obtain digital samples of the measurement signal. For this purpose, the half-bridge driver circuit may comprise an analog-to-digital converter (ADC) and a processing circuit configured to selectively acquire a digital sample of the measurement signal via the ADC in response to a trigger signal.

In various embodiments, the trigger signal is generated by a synchronization circuit configured to analyze the high side control signal or the low side control signal.

For example, in various embodiments, the synchronization circuit is configured to determine via a first digital counter a first value indicative of the switch-on duration of the high side control signal by monitoring the rising and falling edges either of the high side control signal or of the low side control signal. For example, for this purpose, the synchronization circuit may comprise an edge detector configured to generate a first signal in response to a rising edge of the high side control signal and a second signal in response to a falling edge of the high side control signal. Accordingly, the first digital counter may be started in response to the first signal and the first value may be determined by sampling the count value of the first digital counter in response to the second signal.

In various embodiments, the synchronization circuit is configured to determine a second value indicative of the switching period of the high side control signal. For example, the second value may be programmable and provided via a communication interface of the half-bridge driver circuit. Alternatively, as will be described in greater detail in the following, the second value may be determined as a function of a maximum count value provided by the first digital counter.

In various embodiments, the synchronization circuit is configured to compute, as a function of the first value and the second value, a third value indicative of the first count value of the first digital counter when a next switching period of the high side control signal starts. Accordingly, by comparing the third value with the first count value of the first digital counter, the synchronization circuit generates a third signal when the next switching period of the high side control signal starts.

In various embodiments, the synchronization circuit is configured to starting a second digital counter in response to the third signal and compare the count value of the second digital counter with at least one reference value, thereby generating a fourth signal, wherein the fourth signal is used to generate the trigger signal for sampling the measurement signal.

In various embodiments, the half-bridge driver circuit may be configured to drive three half-bridges, which, e.g., may drive a three-phase motor. Accordingly, in this case, the half-bridge driver circuit comprises two further high side driver circuits configured to generate two further high side drive signals as a function of two further high side control signal and two further low side driver circuit configured to generate two further low side drive signals as a function of two further low side control signal. Moreover, e.g., in order to monitor a further phase current of a motor, the half-bridge driver circuit may comprise at least two further measurement terminals configured to be connected to the terminals of at least one further shunt resistor. Accordingly, in this case, the processing circuit may also acquire selectively a further digital sample indicative of the current flowing through the further shunt resistor in response to a further trigger signal. For example, the further trigger signal may be generated by also processing one of the further high side or low side control signals, or by comparing the count value of the second digital counter with a further reference value.

In various embodiments, the half-bridge driver circuit may provide the digital sample to another external device. For example, in various embodiments, the half-bridge driver circuit comprises a digital-to-analog converter (DAC) connected to an output terminal of the half-bridge driver circuit, and the processing circuit is configured to provide the digital sample of the measurement signal to the DAC.

BRIEF DESCRIPTION OF THE DRAWINGS

Embodiments of the present disclosure will now be described with reference to the annexed drawings, which are provided purely by way of non-limiting example and in which.

DETAILED DESCRIPTION OF ILLUSTRATIVE EMBODIMENTS

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

In the following FIGS. 7 to 12, parts, elements or components which have already been described with reference to FIGS. 1 to 6 are denoted by the same references previously used in such Figures; the description of such previously described elements will not be repeated in the following in order not to overburden the present detailed description.

As mentioned in the foregoing, the present disclosure relates to a half-bridge driver circuit, such as a half-bridge driver IC.

Figure 6:
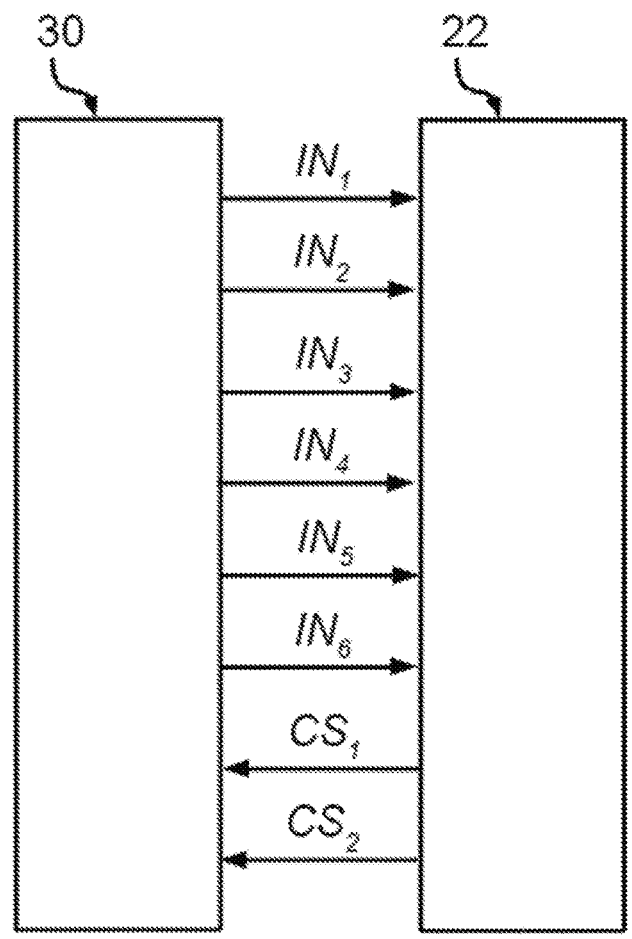
FIGS. 5 and 6 show an example of a half-bridge driver.
Figure 5:
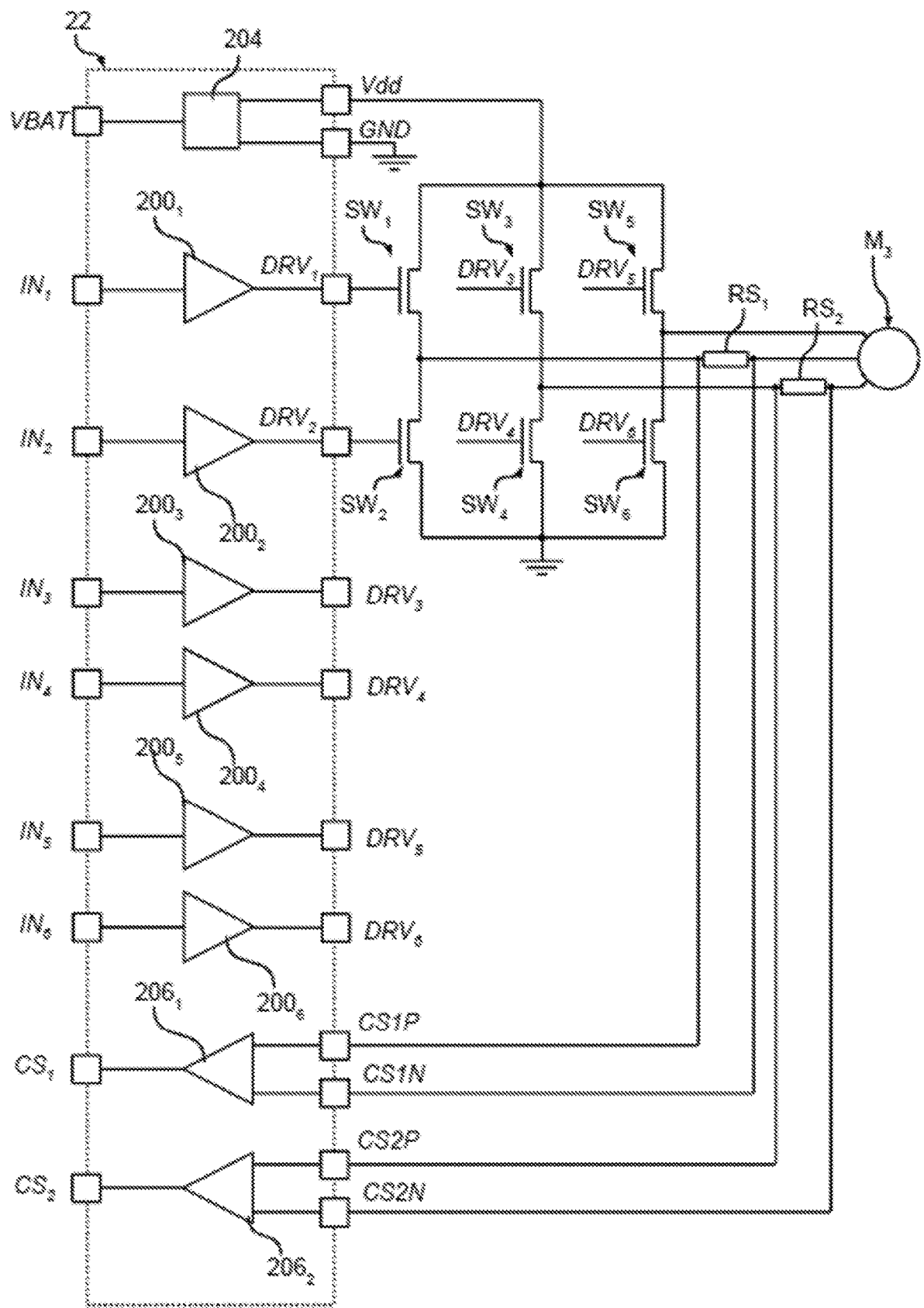

As described in the foregoing, in the architecture shown in FIGS. 5 and 6, the signal generation circuit 30, such as a microcontroller, is configured to generate six PWM signals $IN_1 \ldots IN_6$, which are provided at respective inputs to a driver IC 22, and monitor the measurement signals $CS_1$, $CS_2$. For example, when using a microcontroller 30, such a microcontroller 30 may comprise a microprocessor programmed via software instructions and one or more ADCs. Accordingly, the microcontroller 30 may convert via the ADC the measurement signal(s) $CS_1$, $CS_2$ into digital samples which may be processed by the microprocessor via software instructions.

Figure 3:
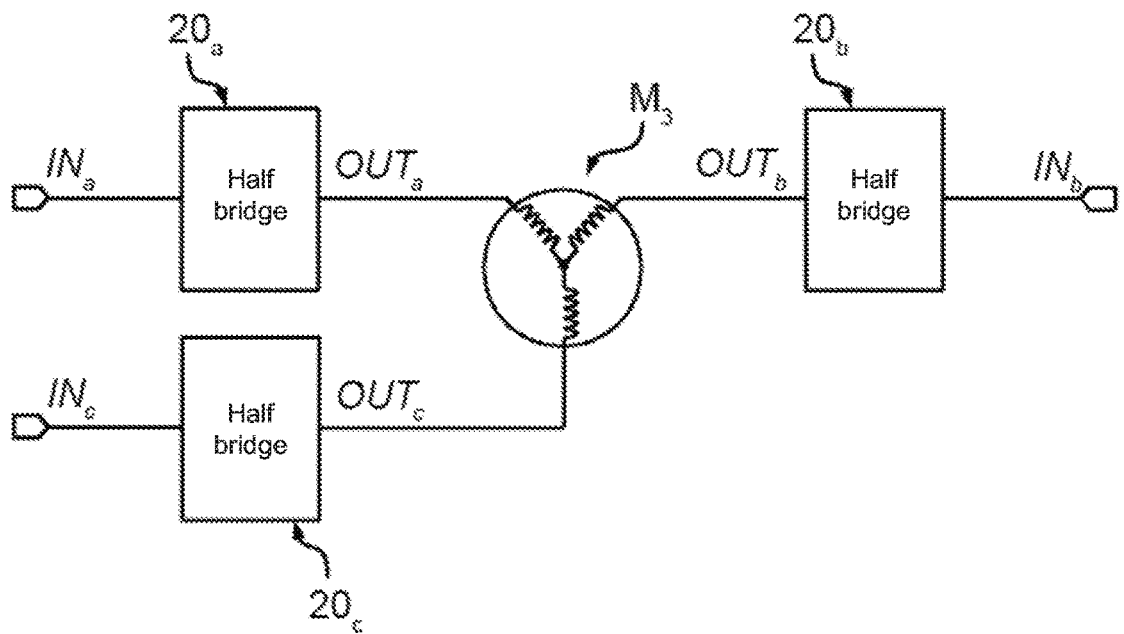

Specifically, when driving a three-phase motor $M_3$ as shown in FIG. 3, the various outputs $OUT_a$, $OUT_b$ and $OUT_c$ are sequentially connected to the supply voltage Vdd (and Ground GND), as described e.g., in document "AN1088—APPLICATION NOTE—L6234 THREE PHASE MOTOR DRIVER", STMicroelectronics, April 2001, which is incorporated herein by reference. In order to correctly drive the motor $M_3$, usually the amplitude of the motor current is used. However, due to the sequential driving, each phase current will comprise intervals in which the respective current is positive, zero or negative. Thus, in order to correctly determine signals, each indicative of the amplitude of a respective motor phase current, the microcontroller 30 usually synchronizes the measurement of the measurement signal(s) $CS_1$, $CS_2$ with the control signals $IN_1 \ldots IN_6$.

However, in many applications it would be preferable that such measurement signals are provided directly by the driver IC 22.

Figure 7:
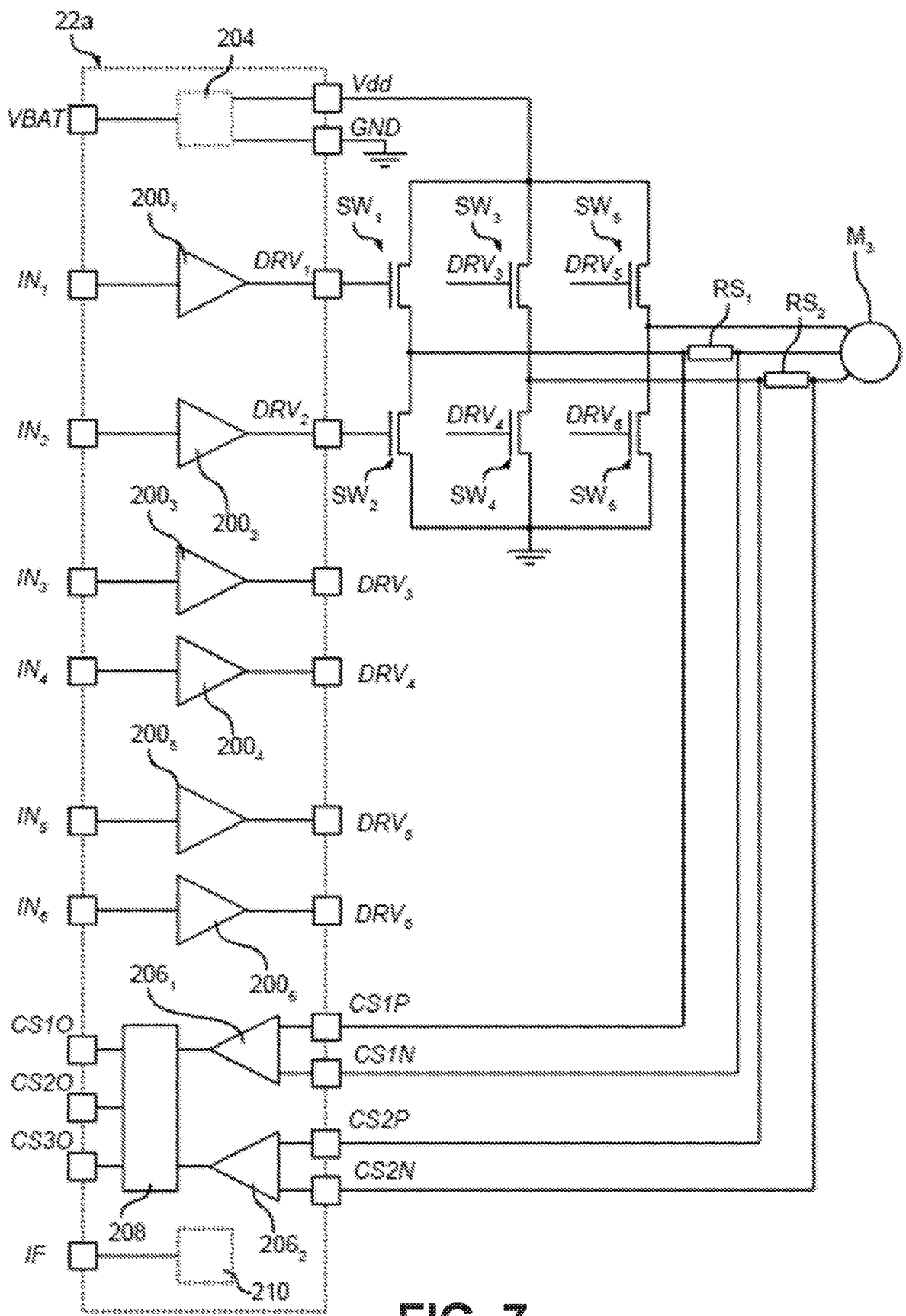
FIG. 7 shows an embodiment of a half-bridge driver comprising a digital processing circuit.

For example, FIG. 7 shows an embodiment of a driver circuit 22a configured to receive at respective inputs six control signals $IN_1 \ldots IN_6$ and generate at respective outputs respective drive signals $DRV_1$, $DRV_3$ and $DRV_5$ for three high side switches $SW_1$, $SW_3$ and $SW_5$ and respective drive signals $DRV_2$, $DRV_4$ and $DRV_6$ for three low side switches $SW_2$, $SW_4$ and $SW_6$. In the embodiment considered, the basic architecture of the circuit 22a corresponds to the architecture of the circuit 22 shown in FIG. 5 and the respective description fully applies. Specifically, also in this case, the driver circuit 22a, such as an (e.g., monolithic) integrated circuit, comprises three high side drivers $200_1$, $200_3$ and $200_5$ configured to generate the drive signals $DRV_1$, $DRV_3$ and $DRV_5$ for three high side switches $SW_1$, $SW_3$ and $SW_5$ and three low side drivers $200_2$, $200_4$ and $200_6$ configured to generate the drive signals $DRV_2$, $DRV_4$ and $DRV_6$ for three low side switches $SW_2$, $SW_4$ and $SW_6$. Optionally, the driver circuit 22a may also comprise the electronic converter 204 configured to generate the supply voltage Vdd.

Accordingly, in the embodiment considered, the driver circuit 22a is arranged to drive N=3 half-bridges, where the driver circuit 22a comprises for each half-bridge a respective high side driver and a respective low side driver. Generally, the driver circuit 22a could also be configured to drive less (e.g., one or two) or more half-bridges. Moreover, the high side and low side switches may also be integrated directly in the integrated circuit comprising the driver circuit 22a.

Figure 1:
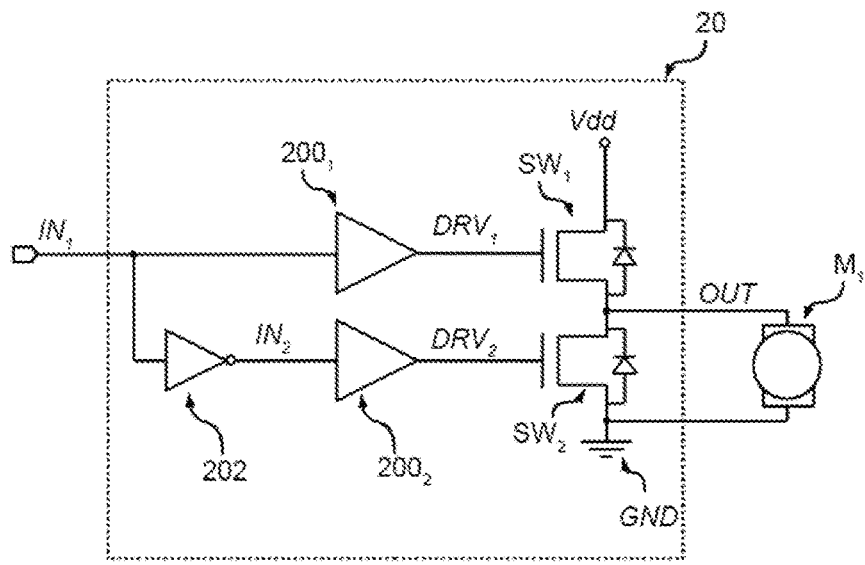
FIGS. 1, 2, 3 and 4 show solutions for driving a motor.
Figure 2:
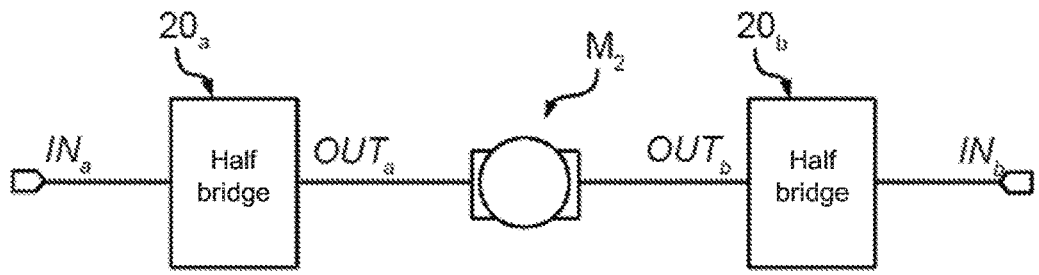

Generally, even though being arranged to drive N=3 half-bridges, the driver circuit 22a may also be used to drive a motor $M_1$ connected between the output of a half-bridge and ground GND (see FIG. 1). For example, for this purpose, only two drive signals (e.g., $DRV_1$ and $DRV_2$) of the driver circuit 22a may be used. Similarly, the driver circuit 22a may also be used to drive a motor $M_2$ connected between the outputs of two half-bridge (see FIG. 2). For example, for this purpose, only four drive signals (e.g., $DRV_1 \ldots DRV_4$) of the driver circuit 22a may be used.

Thus, generally, the driver circuit 22a may be configured to drive a single-phase motor via one or two half-bridges, or a multi-phase motor (e.g., a three-phase motor) via a corresponding number of half-bridges.

In the embodiment considered, the driver circuit 22a comprises moreover at least one differential amplifier 206 configured to be connected to the terminals of a shunt resistor RS connected in series with a phase of a motor M. In various embodiments, when being arranged to drive a single-phase motor, only a single shunt resistor RS is used. Conversely, when being arranged to drive a multi-phase motor (N≥3), the number K of shunt resistors RS may correspond to:

the number of phases of the motor/number of half-bridges (i.e., K=N); or the number of phases of the motor/number of half-bridges minus one (i.e., K=N−1).

In the embodiment considered, the driver circuit 22a comprises for each of the K shunt resistors RS two terminals. For example, in the exemplary case of K=2 shunt resistors, the driver circuit 22a comprises:

two terminals CS1P and CS1N configured to be connected to the terminals of a first shunt resistor $RS_1$ connected in series with a first phase of the motor $M_3$; and two terminals CS2P and CS2N configured to be connected to the terminals of a second shunt resistor $RS_2$ connected in series with a second phase of the motor $M_3$.

In various embodiment, the driver circuit 22a may comprise also two terminals CS3P and CS3N (not shown in FIG. 7) configured to be connected to the terminals of a third shunt resistor $RS_3$ connected in series with a third phase of the motor $M_3$.

Specifically, in the embodiment considered, each two terminals are provided to a respective differential amplifier 206. For example, in the embodiment considered, the terminals CS1P and CS1N are connected to the input terminals of a first differential amplifier $206_1$ and the terminals CS2P and CS2N are connected to the input terminals of a second differential amplifier $206_2$. Generally, the driver circuit 22a could also comprise a third differential amplifier $206_3$ for the terminals CS3P and CS3N.

In various embodiments, the gain of the differential amplifiers 206 may be programmable. For example, in various embodiments, the driver circuit 22a may comprise a communication interface 210 connected to one or more interface terminals IF. For example, the communication interface 210 may be serial communication interface, such as Inter-Integrated Circuit ($I^2C$), Serial Peripheral Interface bus (SPI), or Universal asynchronous receiver-transmitter (UART).

In the embodiment considered, each differential amplifier 206 provides at respective outputs a respective analog measurement signal CS indicative of the current flowing through a respective shunt resistor RS (a respective phase current). As will be described in the following, the number L of differential amplifiers 206 may be less than the number K of shunt resistors, e.g., by connecting a differential amplifier 206 sequentially (via the respective terminals of the driver circuit 22a) to different shunt resistors RS.

In the embodiment considered, the measurement signal(s) CS at the output of the differential amplifier(s) 206 are provided to a processing circuit 208.

Figure 8:
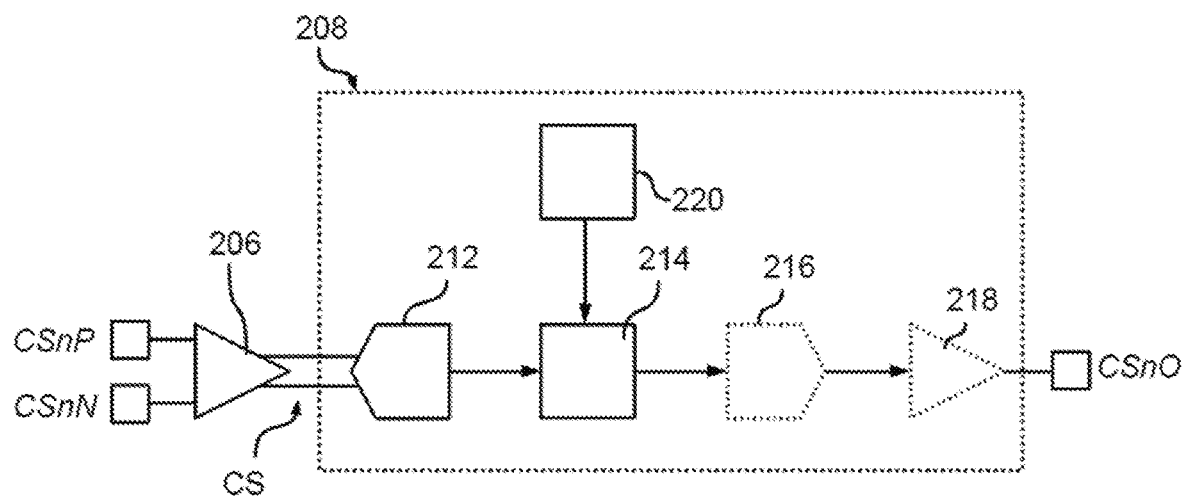
FIG. 8 shows an embodiment of a digital processing circuit of the half-bridge driver of FIG. 7, where the digital processing circuit comprises a synchronization circuit.

For example, FIG. 8 shows an embodiment of the processing circuit 208.

In the embodiment considered, only one generic differential amplifier 206 being connected to two terminals CSnP and CSnN is shown. However, as mentioned before, the driver circuit 22a may include a differential amplifier 206 for each shunt resistor RS, i.e., L=K.

In the embodiment considered, the signal(s) CS at the output of the differential amplifier(s) 206 are connected to one or more ADCs 212. In various embodiments, the number M of ADCs 212 corresponds to the number L of differential amplifiers 206, where the input of each ADC 212 is connected to the output a respective differential amplifier 206. As will be described in the following, the number M of ADCs 212 may be less than the number L of differential amplifiers 206, e.g., by connecting an ADC 212 sequentially to different differential amplifiers 206.

In the embodiment considered, the digital signal(s) at the output of the ADCs 212 are provided to a digital processing circuit 214.

Specifically, independently from the number L of differential amplifiers 206 and number M of ADCs 212, the processing unit 214 is configured to acquire the digital samples indicative of the K phase currents flowing through the K shunt resistors RS.

For example, in the embodiment considered relating to a three-phase motor, the digital processing circuit 214 is configured to sample the digital versions of the signal(s) CS and determine signals CS1O, CS2O and CS3O indicative of the amplitude of the three phase currents. Specifically, when using three current sensors RS, the digital processing circuit 214 may determine directly the amplitude of the three phase currents CS1O, CS2O and CS3O as a function of the digital samples of the signals $CS_1$, $CS_2$ and $CS_3$. Conversely, when using two current sensors RS, the digital processing circuit 214 may obtain the samples of the signals $CS_1$, $CS_2$ and compute the amplitude of the third phase current CS3O as a function of these samples.

Generally, the signals CS1O, CS2O and CS3O may be provided as digital signals, e.g., via the communication interface 210. Conversely, in the embodiment shown in FIG. 8, the processing circuit 208 comprises three DACs 216 (and optionally respective driver circuits 218), in order to generate analog signal CS1O, CS2O and CS3O, each indicative of the amplitude of a respective phase current, where the analog signals CS1O, CS2O and CS3O are provided to respective pins of the driver circuit 22a. In various embodiments, the number of output signals (CS1O, CS2O and CS3O) corresponds thus to the number of phases of the motor to be driven. Moreover, when using analog output signals, the number of DACs 216 (and respective driver circuits 218) corresponds to the number of output signals.

As mentioned before, the measurement of the phase currents should be synchronized with the PWM signals $IN_1 \ldots IN_6$. For example, for this purpose the processing circuit 208 may comprise a synchronization circuit 220 configured to generate one or more control signals signaling to the digital processing circuit 214 that one or more of the signals provided by the ADC(s) 212 should be sampled. Accordingly, the processing circuit 208 implements a sample and hold circuit for the phase currents, which are sampled in response to the control signal(s) provided by the synchronization circuit 220.

Generally, in order to synchronously measure (and possibly calculate) each motor phase current, the sampling of the processing circuit 208 should be synchronized with the switching period $T_{PWM}$ (see, e.g., FIG. 4) of the respective PWM signals, i.e.:

the measurement of the phase current CS1O should be synchronized with the switching period of the control signal $IN_1$ (corresponding to the switching period of the control signal $IN_2$);

the measurement of the phase current CS2O should be synchronized with the switching period of the control signal $IN_3$ (corresponding to the switching period of the control signal $IN_4$); and the measurement/calculation of the phase current CS3O should be synchronized with the switching period of the control signal $IN_5$ (corresponding to the switching period of the control signal $IN_6$).

In various embodiments, the duration of these three switching periods are the same, but the switching periods may be phase shifted. In various embodiments, in order to detect each switching period, the synchronization circuit 220 is thus configured to determine the starting time of each PWM period.

Figure 4:
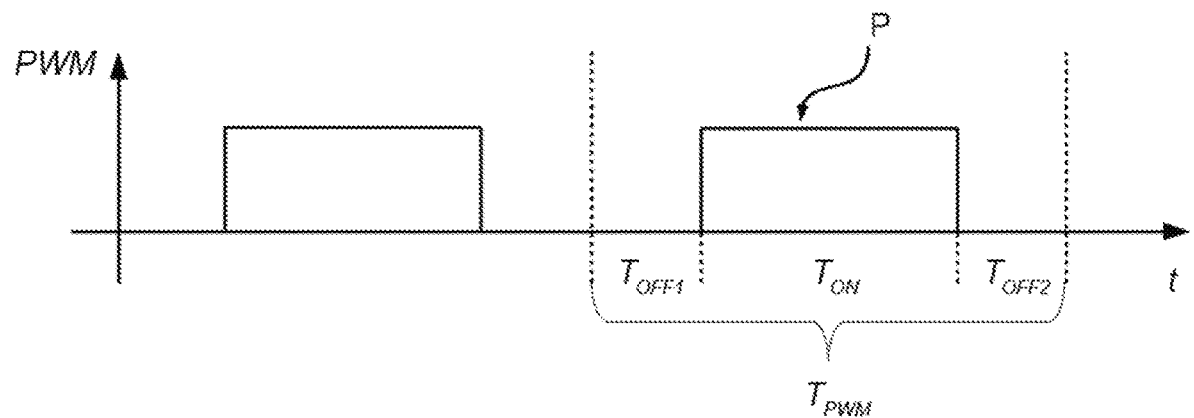

Generally, various schemes of PWM signals exist (see, e.g., FIG. 4). In case of edge-aligned PWM strategy (or asymmetric PWM), the starting time of each PWM period coincides with the rising edge (left-aligned PWM, i.e., $T_{OFF1}=0$) or with the falling edge (right-aligned PWM, i.e., $T_{OFF2}=0$) of each PWM signal. Conversely, in the center-aligned PWM strategy (symmetric PWM), the PWM pulse P is in the center of the switching period, i.e., $T_{OFF1}=T_{OFF2}$.

For example, symmetric PWM is often used in high-end automotive application, e.g., because it has been shown that symmetric PWM signals generate fewer harmonics in the output currents and voltages.

Thus, when using a signal generator circuit 30 configured to generate center-aligned PWM signals (symmetric PWM), the synchronization circuit 220 may not directly detect the starting time of the PWM periods from the PWM signals. For example, for this purpose, the signal generator 30 may provide a synchronization signal to the synchronization circuit 220. For example, the synchronization signal, which corresponds to a seventh signal in addition to the six PWM signals $IN_1 \ldots IN_6$, may be a PWM signal with 50% duty cycle, thereby indicating both the start and the center of the PWM period. However, this solution has several drawbacks. For example, additional pins and wiring are required to transfer the synchronization signal to the driver circuit 22a, and typical PWM signal generator ICs 30 are often based on dedicated hardware components which do not provide such a synchronization signal. Moreover, even knowing the starting instant and duration of one of the PWM periods, still the PWM periods of the other (phase shifted) PWM signals would have to be determined.

Accordingly, in various embodiments, the synchronization circuit 220 is configured to determine the starting time of each PWM period from the center-aligned PWM signals.

Figure 9:
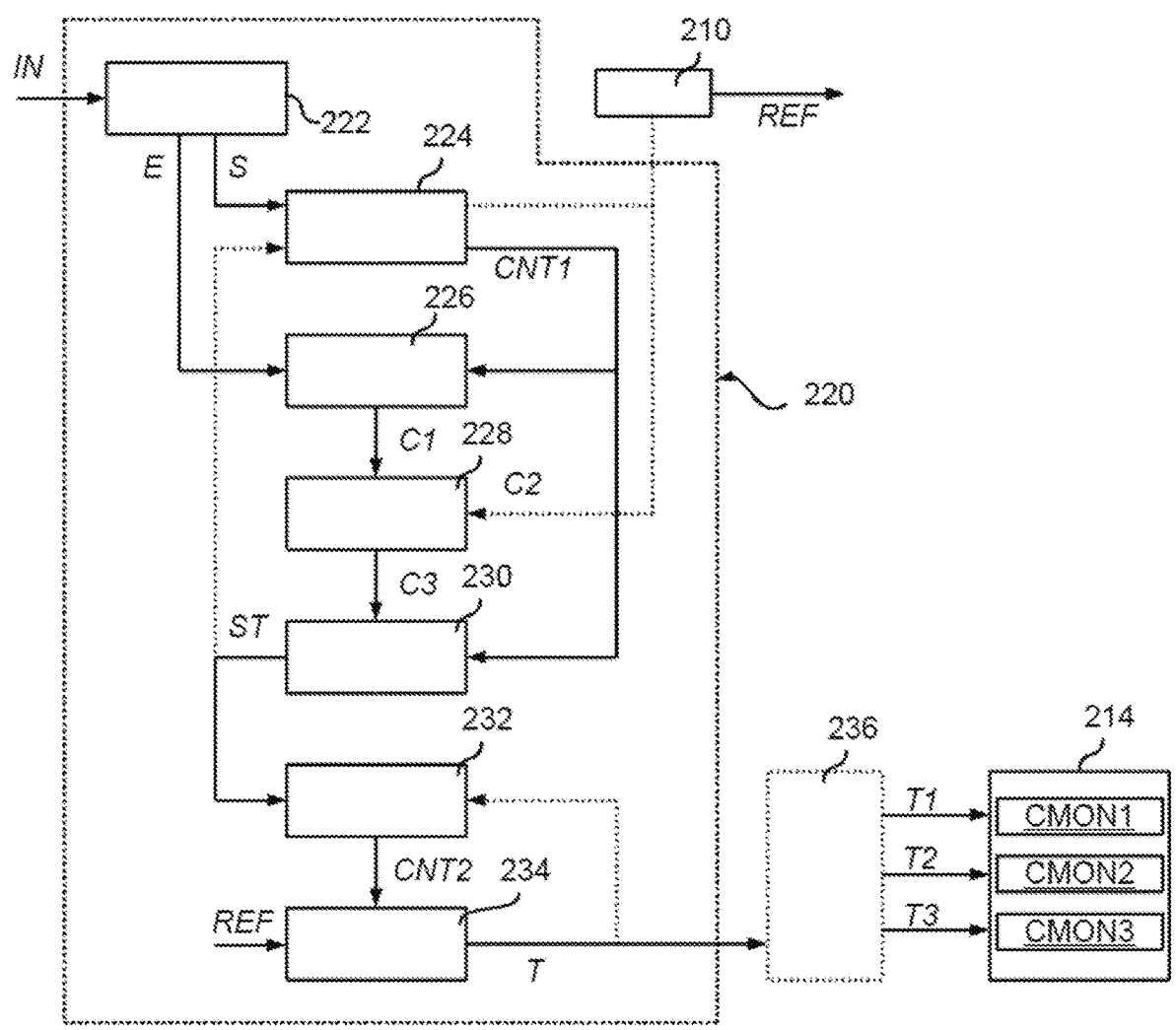
FIG. 9 shows an embodiment of the synchronization circuit of the digital processing circuit of FIG. 8.

FIG. 9 shows a block diagram of the synchronization circuit 220, and steps performed by the synchronization circuit 220, according to some embodiments.

In the embodiment considered, the synchronization circuit 220 implements an auto-trigger module configured to generate three trigger signals T1, T2 and T3, which are provided to the digital processing module 214, where each trigger signal T1, T2 and T3 triggers the acquisition of a respective measurement current CS1O, CS2O or CS3O.

For example, FIG. 9 shows that the digital processing circuit 214 may comprise three hardware or software modules, where:

the first module CMON1 is configured to determine the measurement signal CS1O by sampling the signal $CS_1$ in response to the first trigger signal T1, the second module CMON2 is configured to determine the measurement signal CS2O by sampling the signal $CS_1$ in response to the second trigger signal T2, and the third module CMON3 is configured to either determine the measurement signal CS3O by sampling the signal $CS_3$ (when using a third current sensor), or by sampling the signals $CS_1$ and $CS_2$ (and computing the signal CS3O) in response to the third trigger signal T3.

When using three current sensors RS, and three pairs of terminal CSnP/CSnN, a single ADC 212 may be used to measure each of the signals $CS_1$, $CS_2$ and $CS_3$ in response to the trigger signals T1, T2 and T3. When using two current sensors $RS_1$ and $RS_2$, preferably two ADCs 212 are used in order to sample contemporaneously the signals $CS_1$ and $CS_2$ in response to the third trigger signal T3. In various embodiments, the number of differential amplifiers 206 corresponds either:

to the number of current sensors RS and, in case the number of ADC(s) 212 is smaller than the number of differential amplifiers 206, at least one of the ADC 212 may be connected selectively to a plurality of current sensors RS; or to the number of ADC(s) 212 and, in case the number of differential amplifiers 206 is smaller than the number of current sensors RS, at least one of the differential amplifiers 206 may be connected selectively to a plurality of current sensors RS.

Generally, the number of modules CMON1 . . . CMON3 corresponds to the number of output signals CSnO, where each module is activated in response to a respective trigger signal T1 . . . T3.

Generally, assuming the driving of a three-phase motor, the synchronization circuit 220 may:

generate the trigger signal T1 as a function of the control signal $IN_1$ or, alternatively, the control signal $IN_2$, which has the inverted switching period;

generate the trigger signal T2 as a function of the control signal $IN_3$ or, alternatively, the control signal $IN_4$, which has the inverted switching period; and generate the trigger signal T3 as a function of the control signal $IN_5$ or, alternatively, the control signal $IN_6$, which has the inverted switching period.

For example, in various embodiments, the control signals $IN_1$, $IN_3$ and $IN_5$ for the high side switches are used.

Specifically, FIG. 9 shows the blocks of the synchronization circuit 220 configured to generate a single control signal T for one motor phase by monitoring a respective control signal IN (e.g., the control signal for the high side switch), and the same blocks may be repeated also for the other motor phases.

In the embodiment considered, the control signal IN is provided to an edge detector 222. Specifically, in the embodiment considered, the edge detector 222 is configured to:

detect a rising edge of the control signal IN and generate a first signal S in response to a detected rising edge; and detect a falling edge of the control signal IN and generate a second signal E in response to a detected falling edge.

For example, the edge detector 222 may be implemented with an asynchronous circuit or a synchronous circuit operating in response to a clock signal CLK. For example, in order to detect an edge, a synchronous edge detector 222 may monitor the value of the signal IN during two (or more) consecutive clock cycles of the clock signal CLK. For example, in this case, once having detected the respective edge, the signals S and E may be set to a given logic value for one or more clock cycles. Thus, in various embodiments, the signals S and E may correspond to trigger signals.

Figure 10:
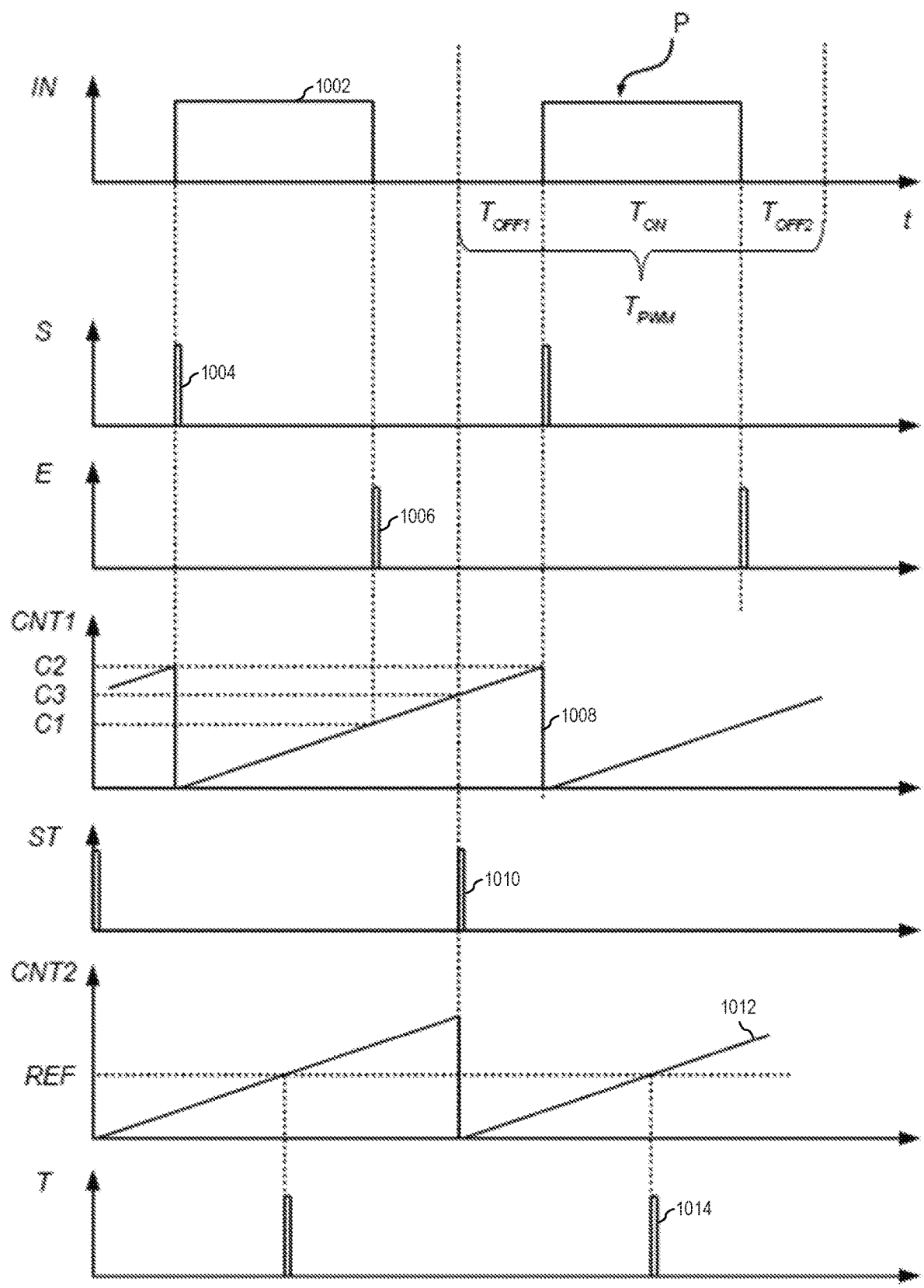
FIGS. 10, 11 and 12 show exemplary waveforms of the synchronization circuit of FIG. 9.

For example, in FIG. 10, curve 1002 shows a PWM signal IN, and curves 1004 and 1006 show corresponding signals S and E.

In the embodiment considered, the signal S is provided to a digital counter 224. Specifically, the counter 224 is configured to determine a count value CNT1 by increasing the count value CNT1 in response to the clock signal CLK.

In the embodiment considered, the signal E is provided to a sample circuit 226, which is configured to provide at an output a signal C1 by storing the count value CNT1 of the counter 224 in response to the signal E, i.e., the sample circuit 226 stores the count value CNT1 at the falling edge of the signal IN. For example, this is schematically shown by curve 1008 of FIG. 10 (curve 1008 shows count value CNT1 versus time), where the sample circuit 226 stores a value C1 corresponding to the count value CNT1 when the signal E is set.

Accordingly, in the embodiment considered, the sample circuit 226 provides a signal C1 indicative of the switch-on duration $T_{ON}$ of the signal IN.

In various embodiments (see also FIG. 10), the digital counter 224 resets the count value CNT1 in response to the signal S, i.e., the count value CNT1 is reset at the rising edge of the signal IN. In this case, the counter 224 may provide at an output also a value C2 corresponding to the last value of the count value CNT1 before the value is reset, i.e., to the maximum value of the counter 224.

Generally, in case of a fixed switching duration $T_{PWM}$ with a fixed duty cycle D for the signal IN, the value/signal C2 is also fixed and the signal C2 is equal to a value CPWM indicative of the fixed switching duration $T_{PWM}$, i.e., the value CPWM corresponds to the number of clock cycles which have the duration $T_{PWM}$. Accordingly, in this case, the counter 224 provides (in addition to the counter value CNT1) a signal C2 indicative of the switching period $T_{PWM}$ of the signal IN.

On the other hand, in case of a fixed switching duration $T_{PWM}$ with a variable duty cycle D for the signal IN, the value C2 provided by the counter 224 may not be constant. Specifically, considering two consecutive PWM cycles, the value C2 may be:

$$C2_{N-1}=C1_{N-1}+COFF2_{N-1}+COFF1_N \quad (4)$$

where COFF2 and COFF1 are count values being proportional to the switch-off durations $T_{OFF1}$ and $T_{OFF2}$, respectively, where $C2_{N-1}$, $C1_{N-1}$ and $COFF2_{N-1}$ are referred to the $N-1^{th}$ PWM period and $COFF1_N$ is referred to the $N^{th}$ PWM period. Moreover, usually $COFF1_{N-1}=COFF2_{N-1}$ and $COFF1_N=COFF2_N$.

In various embodiments, the signals/values C1 and C2 are provided to a digital processing circuit 228. Specifically, the circuit 228 is configured to compute, e.g., in response to an update of the signal C1, the value CPWM according to the following equation:

$$CPWM=((C2_{N-1}-C1_{N-1})*2+C1_{N-1}+C1_N)/2 \quad (5)$$

Generally, the multiplication/division by two may be implemented rather easily with shift left and shift right operations. Moreover, the $1^{st}$ result of equation (5) should be discarded, i.e., the computation of the signal/value CPWM starts continuously after the $2^{nd}$ update of the signal/value C1. Generally, the (missing) first values may also be set, e.g., via the interface 210, before starting the PWM signal.

Generally, in case of a fixed switching duration $T_{PWM}$ the value/signal CPWM may also be set, e.g., via the interface 210 (see also FIG. 9).

Finally, in case of variable switching duration $T_{PWM}$ with a variable duty cycle D for the signal IN, the value C2 may be:

$$C2_{N-1}=C1_{N-1}+COFF2_{N-1}+COFF1_N \quad (6)$$

where $C2_{N-1}$, $C1_{N-1}$ and $COFF2_{N-1}$ are referred to the $N-1^{th}$ PWM period and $COFF1_N$ is referred to the $N^{th}$ PWM period. Moreover, usually $COFF1_{N-1}=COFF2_{N-1}$ and $COFF1_N=COFF2_N$.

In the embodiment considered, the signals/values C1 and C2 are provided to the digital processing circuit 228, which compared to equation (5) has to compensate, however, also the variable duration of the previous cycle. Specifically, in various embodiments, the circuit 228 is configured to compute, e.g., in response to an update of the signal C1, the following equation:

$$CPWM_N=((C2_{N-1}-C1_{N-1})*2+C1_{N-1}+C1_N)-CPWM_{N-1} \quad (7)$$

Again, the $1^{st}$ result may be discarded, i.e., the computation of the signal/value CPWM starts continuously after the $2^{nd}$ update of the signal/value C1. The $1^{st}$ value of CPWM, i.e., $CPWM_0$, can be a fixed known value or may also be set, e.g., via the interface 210, before starting the PWM signal. Generally, this value may also be set for each PWM period, e.g., via the interface 210.

In the embodiment considered, the digital processing circuit 228 then processes the signals/values C1 and CPWM. Specifically, the circuit 228 is configured to compute, e.g., in response to an update of the signal C1, the following equation:

$$C3=C1+(CPWM-C1)/2 \quad (8)$$

The term (CPWM−C1) is indicative of the switch-off duration $T_{OFF}=T_{OFF1}+T_{OFF2}$ of the signal IN. Thus, due to the fact that $T_{OFF1}=T_{OFF2}$, the term (CPWM−C1)/2 is indicative of the duration $T_{OFF1}$ (corresponding to the duration $T_{OFF2}$). For example, the division by 2 may be implemented with a shift right operation.

Accordingly, the signal/value C3 is indicative of the instant when the next PWM cycle starts with respect to start of the counter 224, i.e., the value C3 corresponds to the value of the counter 224 when the next PWM cycle starts.

In the embodiment considered, the count value CNT1 generated by the counter 224 and the value C3 computed by the processing circuit 228 are provided to a digital comparator circuit 230. Specifically, the comparator circuit is configured to set a signal ST when the counter value CNT1 corresponds to the value C3.

Accordingly, the signal ST corresponds to a trigger signal, which is set in the instant when a new PWM cycle starts.

Figure 11:
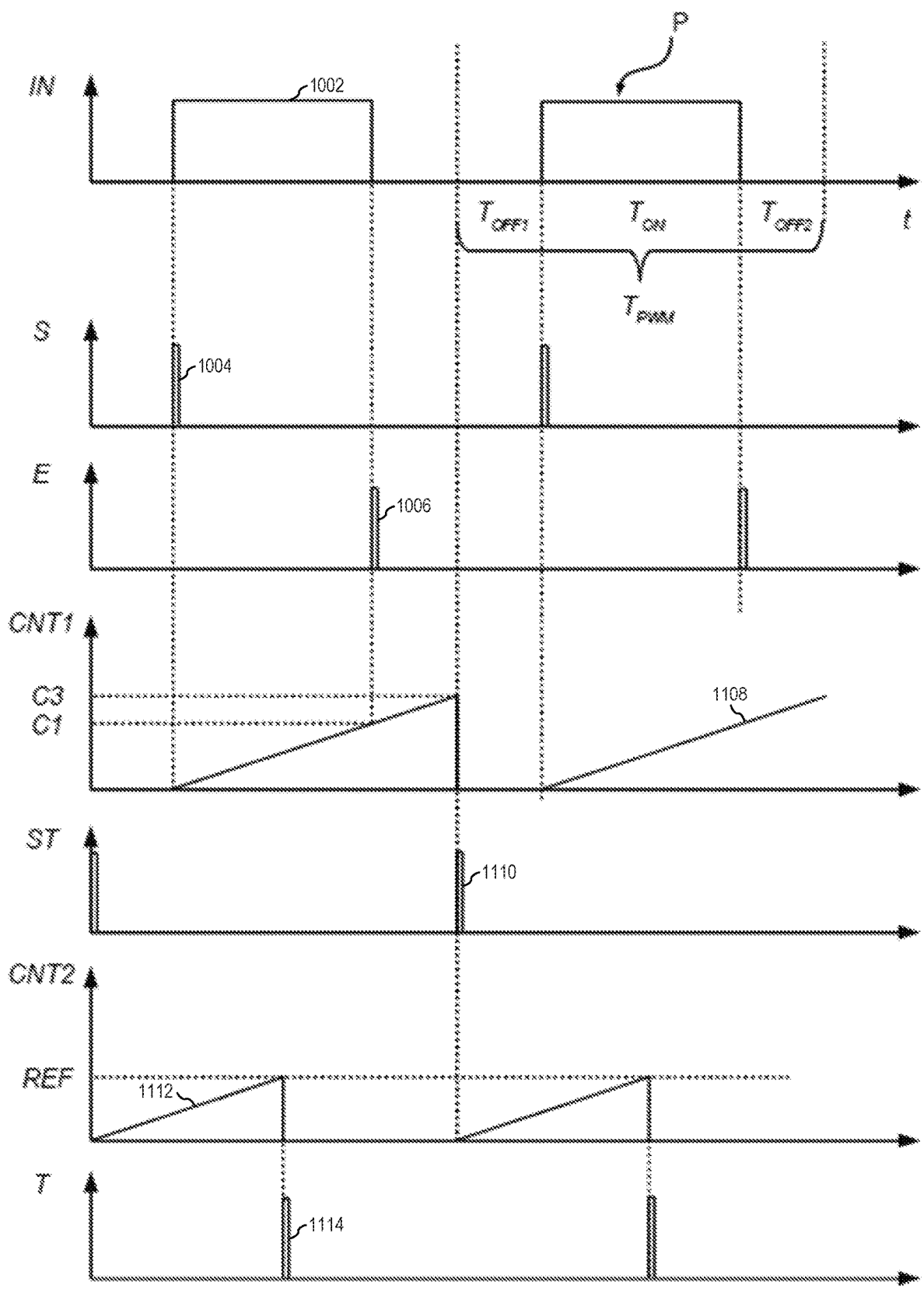

In case the value CPWM is programmable separately, the digital count 224 may start counting in response to the signal S and digital count 224 may stop counting in response to the signal ST. In this case, the reset of the count value CNT1 may be performed in response to the signal S or preferably ST. For example, this behavior is shown in FIG. 11, in particular by curve 1108. Generally, the digital counter 224 may thus start counting from a reset value (usually zero) in response to the signal S, and the counter 224 may be reset between the instant when the count value CNT1 reaches the value C3 (as shown in FIG. 11) and the instant when the signal S is set again (as shown in FIG. 10).

In the embodiment considered, the signal ST is provided to a further digital counter 232. Specifically, in various embodiments, the digital counter 232 is configured to start increasing a further count value CNT2 in response to the signal ST, i.e., the count value CNT2 starts to increase at the instant when a new PWM cycle starts (as shown, e.g., by curve 1012 in FIG. 10).

In various embodiments, the count value CNT2 is provided to a further digital comparator 234. Specifically, in various embodiments, the comparator 234 is configured to generate a signal T when the counter value CNT2 corresponds to a reference value REF. In various embodiments, the reference value may be programmable, e.g., via the interface 210.

Curve 1012 of FIG. 10 shows an embodiment, where the counter 232 is reset in response to the signal ST. Conversely, curve 1112 of FIG. 11 shows an embodiment, where the counter 232 is reset and disabled in response to the signal T. Generally, the digital counter 232 may start counting from a reset value (usually zero) in response to the signal ST, and the counter 232 may be reset between the instant when the count value CNT2 reaches the value REF (as shown in FIG. 11) and the instant when the signal ST is set again (as shown in FIG. 10).

Accordingly, the signal REF is indicative of the time between the start of the switching cycle and the instant when the respective trigger signal T1, T2 or T3 should be generated, thereby permitting to set the instant when the measurement should be performed with respect to the start of the PWM cycle.

In the embodiment considered, the signal T is provided to a control circuit 236, such as a logic circuit, which generates the trigger signals T1, T2 and T3. Specifically, the control circuit 236 may set the trigger signal T1, T2 and T3 associated with the respective signal IN, e.g., T1 for the signal $IN_1$, T2 for the signal $IN_3$, and $T_3$ for the signal $IN_5$. Generally, the control circuit 236 is thus purely optional and the trigger signals T1, T2 and T3 may correspond to the respective signal T. The control circuit 236 may also perform other operations, such as stopping and resetting the counter 232.

In various embodiments, the control circuit 236 may be implemented with a microprocessor or a programmable logic circuit permitting that a user may set/program the operations to be performed in response to the signals T provided by the synchronization circuits 220. Specifically, in various embodiments, the circuit 208 is implemented with a microcontroller comprising a microprocessor and several hardware blocks, such as the ADCs 212 and DACs 216. In this case, the counters 224, 232 and comparators 230, 234 may be implemented with hardware digital counter/timer circuits. Conversely, the control circuit 236 and/or the processing circuit 214 (and optionally the block 228 for the calculation of the value C3) may be implemented via software instructions executed by the microprocessor.

In various embodiments, instead of monitoring a high side control signal (e.g., $IN_1$, $IN_3$ and $IN_5$ for the example considered), each synchronization circuit 220 shown in FIG. 9 may monitor a low side control signals (e.g., $IN_2$, $IN_4$ and $IN_6$ for the example considered).

Figure 12:
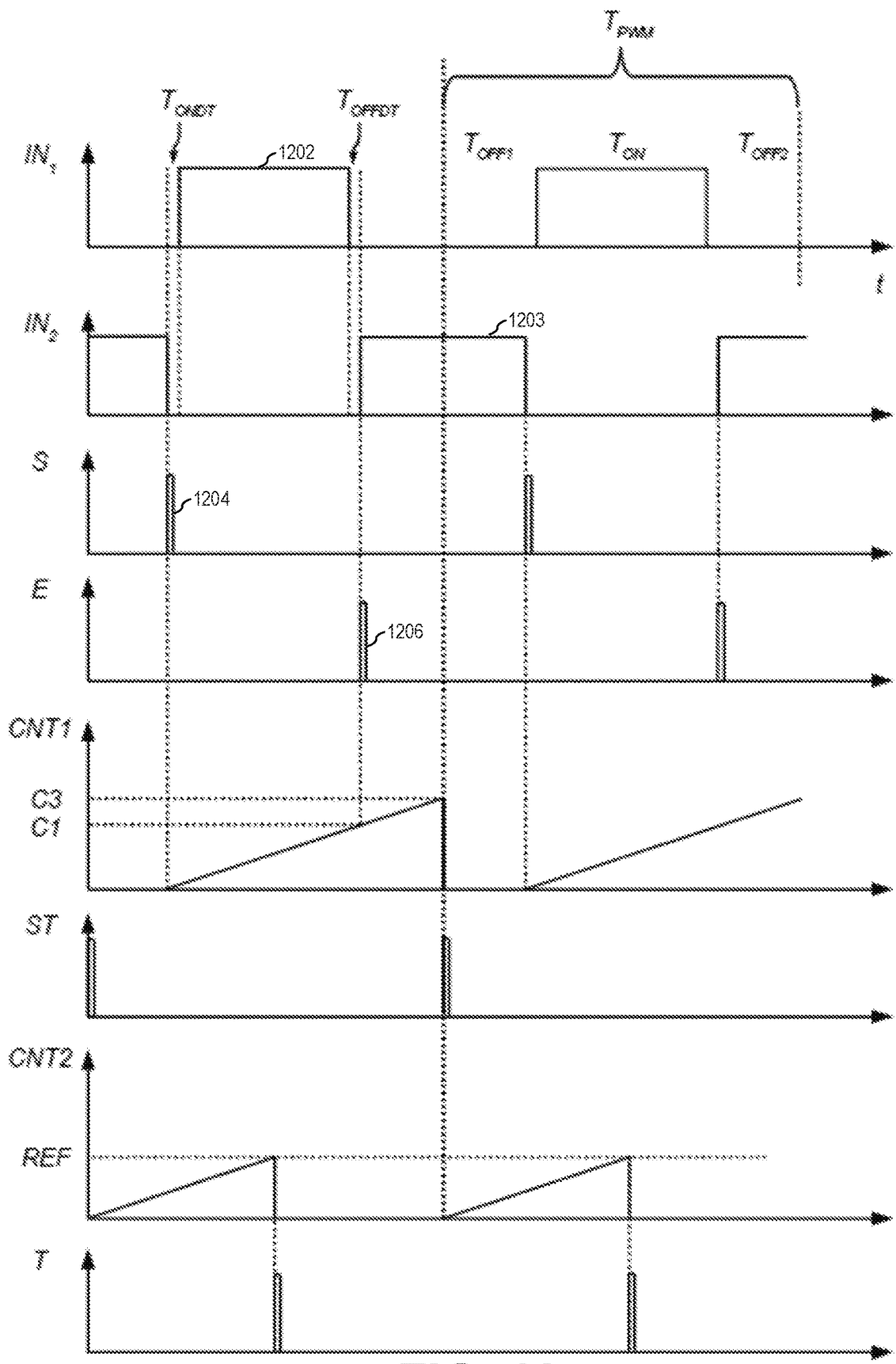

For example, in FIG. 12, curve 1202 of shows a high side control signal, e.g., signal $IN_1$, and curve 1203 shows a respective low side control signal, e.g., signal $IN_2$.

In this case, the edge detector 224 may be configured to receive an inverted low side control signal IN or the edge detector may generate the signal S in response to a falling edge and the signal E in response to a rising edge (see curves 1206 and 1208).

However, as shown by curves 1202 and 1203, often the low side control signal does not correspond to an inverted version of the high side control signal, but additional delays are introduced, i.e.:

a delay $T_{ONDT}$ between the instant when the low side control signal $IN_2$ goes to low and the instant when the high side control signal $IN_1$ goes to high; and a delay $T_{OFFDT}$ between the instant when the high side control signal $IN_1$ goes to low and the instant when the low side control signal $IN_2$ goes to high.

In case delays correspond to $T_{ONDT}=T_{OFFDT}$, the inverted pulse of the low side control signal is center aligned and equation (8) is still valid. Otherwise, the circuit 228 may be configured to compensate these delays. For example, in various embodiments the circuit 228 is configured to compute, e.g., in response to an update of the signal C1, the following equation:

$$C3=C1+(CPWM-(C1-C_{ONDT}+C_{OFFDT}))/2 \quad (9)$$

Specifically, the values $C_{ONDT}$ and $C_{OFFDT}$ correspond to the count values which correspond to the duration $T_{ONDT}$ and $T_{OFFDT}$. For example, these values (or merely the pre-calculated different $C_{OFFDT}-C_{OFFDT}$) may be provided (possibly together with the value CPWM) to the circuit 228 via the communication interface 210. Alternative, the delays may be compensated by adjusting the value of the reference signal REF.

In various embodiments, the synchronization circuit 220 may be configured to support the generation of plural triggers for each control signal IN. For example, for this purpose, the comparator 234 may receive a plurality of reference values REF and generate a trigger in the signal T each time the count value CNT2 corresponds to one of the reference signals REF. Alternatively, the synchronization circuit 220 may comprise a plurality of comparators 234, each configured to generate a respective signal T by comparing the count value CNT2 with a respective reference signal REF. For example, when using the behavior of the counter 232 described with respect to curve 1112 of FIG. 11, the last trigger/last trigger signal may be used to stop and possibly reset the counter 232.

For example, such multiple triggers/trigger signals may be useful in case only a single shunt resistor RS connected in the DC link is used, e.g., a shunt resistor RS connected between the signal Vdd and the high side switches ($SW_1$, $SW_3$, $SW_5$) or a shunt resistor RS connected between the low side switches ($SW_2$, $SW_4$, $SW_6$) and ground GND. Accordingly, each trigger may activate a respective current measurement module CMON1 . . . CSMON3 which assigns to a respective signal CS1O . . . CS3O the current currently measured via the shunt resistor RS.

Similarly, even though using a plurality (e.g., N or N−1) of shunt resistors RS connected in series with the motor phases as described in the foregoing, a single synchronization circuit 220 configured to generate plural triggers/plural trigger signals may be sufficient, when the duration of the switching cycle for all PWM control signals $IN_1$ . . . $IN_6$ is the same and the switching cycle are only phase shifted by a constant amount. For example, in this case each trigger may activate a respective current measurement module CMON1 . . . CSMON3 which assigns to a respective signal CS1O . . . CS3O the respective current measured via the respective shunt resistor RS.

Of course, without prejudice to the principle of the invention, the details of construction and the embodiments may vary widely with respect to what has been described and illustrated herein purely by way of example, without thereby departing from the scope of the present invention, as defined by the ensuing claims.

What is claimed is:

1. A half-bridge driver circuit comprising:
    a high side control input terminal configured to receive a high side control signal, wherein the high side control signal is a center aligned pulse-width-modulated signal having a switching period and a switch-on duration;
    a low side control input terminal configured to receive a low side control signal, wherein the low side control signal corresponds to an inverted version of the high side control signal with a first delay between a falling edge of the low side control signal and a following rising edge of the high side control signal and with a second delay between a falling edge of the high side control signal and a following rising edge of the low side control signal;
    a high side driver circuit configured to generate a high side drive signal as a function of the high side control signal;
    a low side driver circuit configured to generate a low side drive signal as a function of the low side control signal;
    a high side output terminal configured to provide the high side drive signal for a high side switch;

a low side output terminal configured to provide the low side drive signal for a low side switch;

first and second measurement terminals configured to be coupled to terminals of a shunt resistor;

an amplifier configured to amplify a signal applied between the first and second measurement terminals to generate a measurement signal indicative of a current flowing through the shunt resistor;

an analog-to-digital converter (ADC);

a processing circuit configured to selectively acquire a digital sample of the measurement signal via the ADC in response to a trigger signal; and a synchronization circuit that includes first and second digital counters and is configured to generate the trigger signal by:

determining via the first digital counter a first value indicative of the switch-on duration of the high side control signal by monitoring rising and falling edges of the high side control signal or the low side control signal, determining a second value indicative of the switching period of the high side control signal, computing a third value indicative of a first count value of the first digital counter when a next switching period of the high side control signal starts as a function of the first value and the second value, comparing the third value with the first count value of the first digital counter to generate a third signal when the next switching period of the high side control signal starts, starting the second digital counter in response to the third signal, comparing a count value of the second digital counter with a reference value to generate a fourth signal, and generating the trigger signal as a function of the fourth signal.

2. The half-bridge driver circuit of claim 1, wherein:

the synchronization circuit comprises an edge detector configured to generate a first signal in response to a rising edge of the high side control signal and a second signal in response to a falling edge of the high side control signal;

the first digital counter is configured to be started in response to the first signal; and the first value is determined by sampling the count value of the first digital counter in response to the second signal.

3. The half-bridge driver circuit of claim 1, wherein the third value is computed according to the following equation:

$$C3=C1+(CPWM-C1)/2$$

wherein C1 is the first value, CPWM is the second value, and C3 is the third value.

4. The half-bridge driver circuit of claim 1, wherein:

the synchronization circuit comprises an edge detector configured to generate a first signal in response to a falling edge of the low side control signal and a second signal in response to a rising edge of the low side control signal;

the first digital counter is configured to be started in response to the first signal; and the first value is determined by sampling the count value of the first digital counter in response to the second signal.

5. The half-bridge driver circuit of claim 4, wherein the third value is computed according to the following equation:

$$C3=C1+(CPWM-(C1-CONDT+COFFDT))/2$$

wherein C1 is the first value, CPWM is the second value, C3 is the third value, and CONDT and COFFDT are indicative of the first delay and the second delay, respectively.

6. The half-bridge driver circuit of claim 5, wherein the CONDT and the COFFDT are programmable via a communication interface of the half-bridge driver circuit.

7. The half-bridge driver circuit of claim 1, further comprising a communication interface, wherein the second value is programmable via the communication interface of the half-bridge driver circuit.

8. The half-bridge driver circuit of claim 1, wherein the second value is determined as a function of a maximum count value provided by the first digital counter.

9. The half-bridge driver circuit of claim 1, further comprising:

four further input terminals for receiving two further high side control signals and two further low side control signal;

four further output terminals for providing two further high side drive signal for two further high side switches and two further low side drive signals for two further low side switches, two further high side driver circuits configured to generate the two further high side drive signals as a function of the two further high side control signal, respectively;

two further low side driver circuit configured to generate the two further low side drive signals as a function of the two further low side control signal; and two further measurement terminals configured to be connected to terminals of a further shunt resistor, wherein the processing circuit is configured to selectively acquire a further digital sample indicative of a current flowing through the further shunt resistor in response to a further trigger signal.

10. The half-bridge driver circuit of claim 9, further comprising the high side switch, the low side switch, the two further high side switches, and the two further low side switches coupled to the half-bridge driver circuit.

11. The half-bridge driver circuit of claim 9, wherein the synchronization circuit is configured to generate the further trigger signal by processing one of the two further high side control signals or the two further low side control signals.

12. The half-bridge driver circuit of claim 9, wherein the synchronization circuit is configured to generate the further trigger signal by comparing the count value of the second digital counter with a further reference value.

13. The half-bridge driver circuit of claim 1, further comprising a digital-to-analog converter (DAC), wherein the processing circuit is configured to provide the digital sample of the measurement signal to the DAC.

14. The half-bridge driver circuit of claim 1, wherein the half-bridge driver circuit is integrated in a monolithic integrated circuit.

15. A system comprising:

a half-bridge comprising a high side switch, a low side switch and an output, wherein the output of the half-bridge is configured to be coupled to a phase of a motor;

a high side control input terminal configured to receive a high side control signal, wherein the high side control signal is a center aligned pulse-width-modulated signal having a switching period and a switch-on duration;

a low side control input terminal configured to receive a low side control signal, wherein the low side control signal corresponds to an inverted version of the high side control signal with a first delay between a falling edge of the low side control signal and a following rising edge of the high side control signal and with a second delay between a falling edge of the high side control signal and a following rising edge of the low side control signal;

a high side driver circuit configured to generate a high side drive signal as a function of the high side control signal;

a low side driver circuit configured to generate a low side drive signal as a function of the low side control signal;

a high side output terminal configured to provide the high side drive signal to the high side switch;

a low side output terminal configured to provide the low side drive signal to the low side switch;

first and second measurement terminals configured to be coupled to terminals of a shunt resistor;

an amplifier configured to amplify a signal applied between the first and second measurement terminals to generate a measurement signal indicative of a current flowing through the shunt resistor;

an analog-to-digital converter (ADC);

a processing circuit configured to selectively acquire a digital sample of the measurement signal via the ADC in response to a trigger signal; and a synchronization circuit that includes first and second digital counters and is configured to generate the trigger signal by:
- determining via the first digital counter a first value indicative of the switch-on duration of the high side control signal by monitoring rising and falling edges of the high side control signal or the low side control signal,
- determining a second value indicative of the switching period of the high side control signal,
- computing a third value indicative of a first count value of the first digital counter when a next switching period of the high side control signal starts as a function of the first value and the second value,
- comparing the third value with the first count value of the first digital counter to generate a third signal when the next switching period of the high side control signal starts,
- starting the second digital counter in response to the third signal,
- comparing a count value of the second digital counter with a reference value to generate a fourth signal, and
- generating the trigger signal as a function of the fourth signal; and a signal generator configured to generate the high side control signal and the low side control signal.

16. The system of claim 15, further comprising the motor, wherein the output of the half-bridge is coupled to a phase of the motor.

17. The system of claim 16, wherein the motor is a multi-phase motor.

18. A method comprising:
receiving a high side control signal and a low side control signal, wherein the high side control signal is a center aligned pulse-width-modulated signal having a switching period and a switch-on duration, and the low side control signal corresponds to an inverted version of the high side control signal with a first delay between a falling edge of the low side control signal and a following rising edge of the high side control signal and with a second delay between a falling edge of the high side control signal and a following rising edge of the low side control signal;
generating a high side drive signal as a function of the high side control signal;
providing the high side drive signal to a high side switch of a half-bridge;
generating a low side drive signal as a function of the low side control signal;
providing the low side drive signal to a low side switch of the half-bridge;
generating a measurement signal indicative of a current flowing through a shunt resistor coupled to the half-bridge;
determining via a first counter a first value indicative of the switch-on duration of the high side control signal by monitoring rising and falling edges of the high side control signal or the low side control signal;
determining a second value indicative of the switching period of the high side control signal;
computing a third value indicative of a first count value of the first counter when a next switching period of the high side control signal starts as a function of the first value and the second value;
comparing the third value with the first count value of the first counter to generate a third signal when the next switching period of the high side control signal starts;
starting a second counter in response to the third signal;
comparing a count value of the second counter with a reference value to generate a fourth signal;
generating a trigger signal as a function of the fourth signal; and
selectively acquiring a digital sample of the measurement signal in response to the trigger signal.

19. The method of claim 18, further comprising driving a three-phase motor with the half-bridge.

20. The method of claim 18, further comprising:
generating a first signal in response to a rising edge of the high side control signal;
generating a second signal in response to a falling edge of the high side control signal;
starting the first counter in response to the first signal; and
determining the first value by sampling the count value of the first counter in response to the second signal.

21. The method of claim 18, further comprising determining the second value as a function of a maximum count value provided by the first counter.

* * * * *